(12) United States Patent
Oh et al.

(10) Patent No.: US 10,383,227 B2
(45) Date of Patent: Aug. 13, 2019

(54) DISPLAY APPARATUS HAVING A WAVEGUIDE FORMED BY THE BOTTOM CHASSIS FOR WIRELESS COMMUNICATION

(71) Applicant: SAMSUNG ELECTRONICS CO., LTD., Suwon-si (KR)

(72) Inventors: Sang-Gi Oh, Yongin-si (KR); Sang Hyuk Wi, Yongin-si (KR); Chang Geun Yu, Bucheon-si (KR); Sang Ho Hong, Suwon-si (KP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/949,230

(22) Filed: Apr. 10, 2018

(65) Prior Publication Data

US 2018/0302985 A1    Oct. 18, 2018

(30) Foreign Application Priority Data

Apr. 14, 2017    (KR) ........................ 10-2017-0048340

(51) Int. Cl.
*H05K 1/14*    (2006.01)
*F21V 8/00*    (2006.01)
(Continued)

(52) U.S. Cl.
CPC ........... *H05K 1/142* (2013.01); *G02B 6/0085* (2013.01); *G02F 1/13452* (2013.01); *G02F 1/133308* (2013.01); *G06F 1/1601* (2013.01); *G06F 1/1637* (2013.01); *G06F 1/20* (2013.01); *H01P 3/122* (2013.01); *H05K 1/0237* (2013.01); *H05K 1/0274* (2013.01); *H05K 1/18* (2013.01); *H05K 5/0017* (2013.01); *G02B 6/0055* (2013.01);
(Continued)

(58) Field of Classification Search
CPC ... H05K 1/0274; G06F 1/1601; G06F 1/1637; G06F 1/20; G02F 2001/133317
See application file for complete search history.

(56) References Cited

U.S. PATENT DOCUMENTS 8,243,424 B1    8/2012    Babu et al.
2004/0264867 A1    12/2004    Kondo
(Continued)

FOREIGN PATENT DOCUMENTS

| KR | 10-2008-0044615 A | 5/2008 |
| KR | 10-2010-0047317 A | 5/2010 |
| KR | 10-2013-0040661 A | 4/2013 |
| WO | 2016/018558 A1 | 2/2016 |

OTHER PUBLICATIONS

ISR Opinion, Jul. 2018.*
(Continued)

*Primary Examiner* — Tracie Y Green
(74) *Attorney, Agent, or Firm* — Sughrue Mion, PLLC

(57) ABSTRACT

A display apparatus including a waveguide is provided. The display apparatus includes a display panel; a backlight configured to provide light to the display panel; a heat sink configured to absorb heat generated by the backlight; a bottom chassis configured to support the backlight and the heat sink; a first circuit board mounted on the bottom chassis; a second circuit board mounted on the bottom chassis; and a waveguide formed between the first circuit board and the second circuit board.

21 Claims, 10 Drawing Sheets

(51) Int. Cl.
  *H05K 5/00*    (2006.01)
  *H05K 1/02*    (2006.01)
  *H01P 3/12*    (2006.01)
  *H05K 1/18*    (2006.01)
  *G02F 1/1333*  (2006.01)
  *G02F 1/1345*  (2006.01)
  *G06F 1/16*    (2006.01)
  *G06F 1/20*    (2006.01)
  *H01P 11/00*   (2006.01)
  *H04N 5/64*    (2006.01)

(52) U.S. Cl.
  CPC .............. *G02F 2001/13332* (2013.01); *G02F 2001/133314* (2013.01); *G02F 2001/133317* (2013.01); *H01P 11/002* (2013.01); *H04N 5/64* (2013.01); *H05K 2201/10098* (2013.01); *H05K 2201/10128* (2013.01); *H05K 2201/10136* (2013.01); *H05K 2201/10189* (2013.01); *H05K 2201/10257* (2013.01)

(56) References Cited

U.S. PATENT DOCUMENTS

2009/0290832 A1* 11/2009 Kim ................. G02B 6/132
                                                    385/14
2013/0141664 A1   6/2013 Toyoyama
2016/0365899 A1  12/2016 Pelissier et al.

OTHER PUBLICATIONS

Jeon et al. KR20080044615, May 2008.*
Kim et al., KR2013004066, Apr. 2013.*
Communication dated Jul. 10, 2018, issued by the European Patent Office in counterpart European Application No. 18166348.5.
International Search Report (PCT/ISA/210) dated Jul. 17, 2018 issued by the International Searching Authority in International Application No. PCT/KR2018/003846.
Communication dated Jan. 22, 2019, issued by the European Patent Office in counterpart European Patent Application No. 18166348.5.

* cited by examiner

DISPLAY APPARATUS HAVING A WAVEGUIDE FORMED BY THE BOTTOM CHASSIS FOR WIRELESS COMMUNICATION

CROSS-REFERENCE TO RELATED APPLICATION

This application is based on and claims priority under 35 U.S.C. § 119 to Korean Patent Application No. 10-2017-0048340, filed on Apr. 14, 2017, in the Korean Intellectual Property Office, the disclosure of which is incorporated by reference herein in its entirety.

BACKGROUND

1. Field

The disclosure relates to a display apparatus, and more particularly, to a display apparatus including a waveguide for wireless communication between circuit boards installed in the display apparatus.

2. Description of the Related Art

A display apparatus is an output apparatus that converts electrical information to visual information and displays the visual information. The display apparatus may be implemented in various electronic devices, including a television, a monitor, and various kinds of portable terminals (for example, a notebook personal computer (PC), a smart phone, a tablet PC, and the like).

A display apparatus may include a self-emissive display panel such as an Organic Light Emitting Diode (OLED) display, or a non-emissive display panel such as a Liquid Crystal Display (LCD).

A non-emissive display panel may use a light source, such as a backlight, to provide light to the display panel. Backlights are classified into various types, including an edge type backlight in which light sources are arranged along at least one side of a display panel, and a direct type backlight in which light sources are arranged behind a display panel.

The display apparatus includes various circuit boards. The circuit boards are connected to transmit/receive data, signals, or power to/from one another. The circuit boards are connected by electric wires, a Flexible Flat Cable (FFC), or a Flexible Printed Circuit Board (FPCB).

SUMMARY

In accordance with an aspect of the disclosure, there is provided a display apparatus including a waveguide to enable wireless communication between circuit boards installed in the display apparatus.

In accordance with another aspect of the disclosure, there is provided a display apparatus including a bottom chassis on which a waveguide for wireless communication between circuit boards is mounted.

Additional aspects of the disclosure will be set forth in part in the description which follows and, in part, will be obvious from the description, or may be learned by practice of the disclosure.

In accordance with an aspect of the disclosure, there is provided a display apparatus including: a display panel; a backlight configured to provide light to the display panel; a heat sink configured to absorb heat generated by the backlight; a bottom chassis configured to support the backlight and the heat sink; a first circuit board mounted on the bottom chassis; a second circuit board mounted on the bottom chassis; and a waveguide formed between the first circuit board and the second circuit board.

The waveguide may be defined by the bottom chassis.

The waveguide may be defined by the heat sink.

The waveguide may be in a shape of a duct having four sides, the bottom chassis may be coupled with the heat sink, a first side of the four sides of the duct may be defined by the bottom chassis, and a second side of the four sides of the duct may be defined by the heat sink.

A third side and a fourth side of the four sides of the waveguide may be defined by the heat sink.

The bottom chassis and the heat sink may include a metal material.

The waveguide may be in a shape of a duct having four sides, and a height of the waveguide and a width of the waveguide may correspond to a wavelength of electromagnetic waves transceived between the first circuit board and the second circuit board.

A distance between the heat sink and the bottom chassis may be 0.1 mm or less.

The display apparatus may include two or more waveguides, and adjacent waveguides of the two or more waveguides may be spaced at a distance of at least 7 mm.

The first side of the four sides of the waveguide may be formed by processing the bottom chassis by at least one method from among press, injection, and cutting, and the second side, the third side and the fourth side of the four sides of the waveguide may be formed by processing the heat sink by at least one method from among press, injection, and cutting.

The display apparatus may further include a filler material formed in the waveguide.

In accordance with another aspect of the disclosure, there is provided a display apparatus including: a display panel; a first circuit board; a second circuit board; and a waveguide formed between the first circuit board and the second circuit board.

The display apparatus may further include a bottom chassis on which the first circuit board and the second circuit board are disposed, and the waveguide may be defined by the bottom chassis.

The display apparatus may further include a member coupled with the bottom chassis to define the waveguide with the bottom chassis, and the waveguide may be in a duct shape having four sides formed by the bottom chassis and the member.

A first side of the four sides of the waveguide may be formed by processing the bottom chassis by at least one method from among press, injection, and cutting, and a second side, a third side and a fourth side of the four sides of the waveguide may be formed by processing the member by at least one method from among press, injection, and cutting.

The waveguide may be defined by a hole in the bottom chassis.

The bottom chassis and the member may include a metal material.

In accordance with yet another aspect of the disclosure there is provided a display apparatus including: a display panel; a heat sink configured to absorb heat generated by the display panel; a bottom chassis configured to support the display panel and the heat sink; a first circuit board mounted on the bottom chassis; a second circuit board mounted on the bottom chassis; a plurality of first connectors mounted on the first circuit board; a plurality of second connectors mounted on the second circuit board, each of the plurality of second connectors respectively corresponding to one of the plurality of first connectors; and a waveguide configured to convey electromagnetic waves between corresponding connectors of the plurality of first connectors and the plurality of second connectors.

A planar surface of the first circuit board may be parallel to a planar surface of the second circuit board.

The waveguide may include a plurality of waveguides, each of the plurality of waveguides respectively corresponding to one of the plurality of first connectors and one of the plurality of second connectors.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Figure 1:
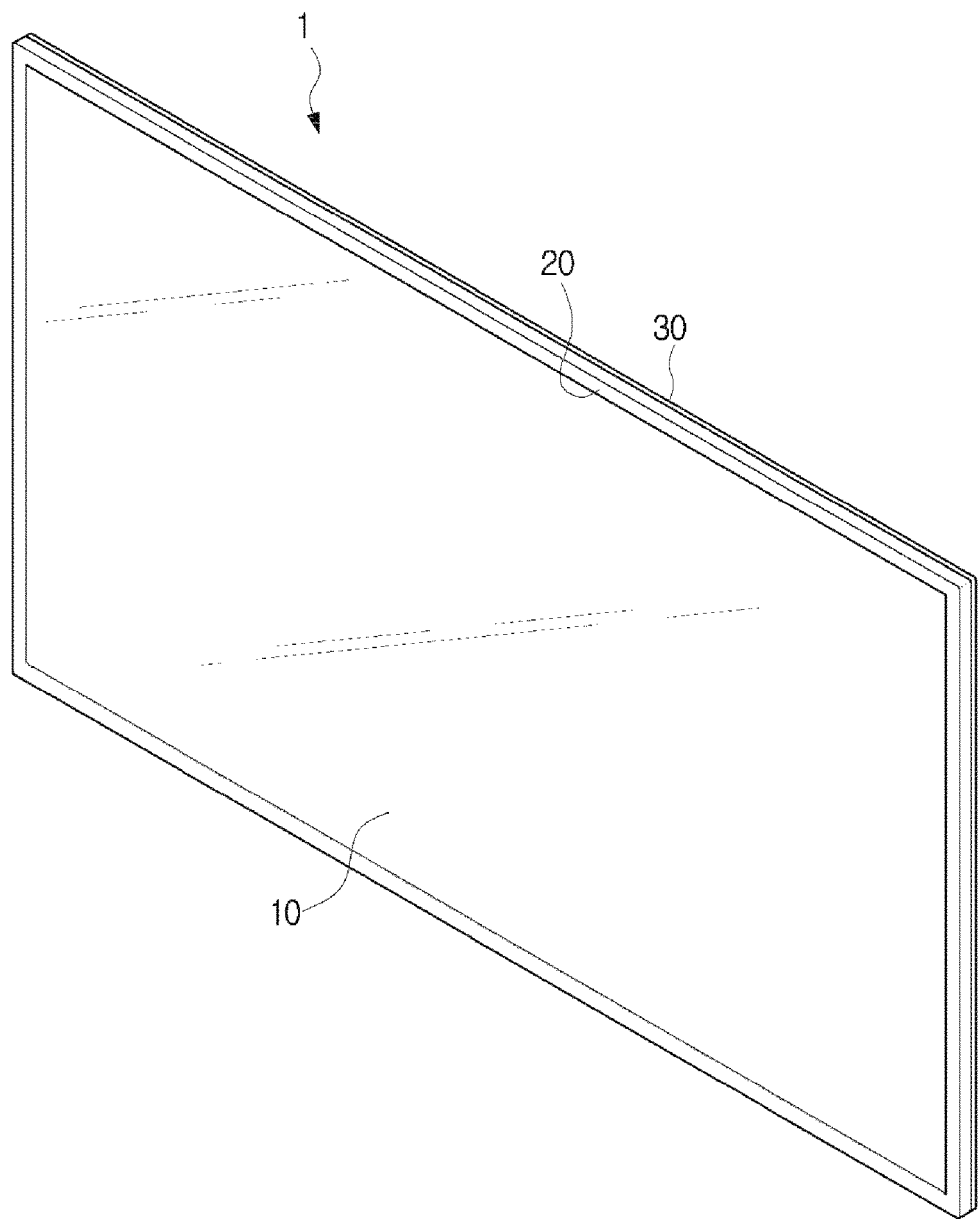
FIG. 1 is a perspective view of a display apparatus according to an embodiment.

Configurations illustrated in the drawings and described in the present specification are examples, and thus it is to be understood that various modifications may be made to the described embodiments and the drawings.

Also, like reference numerals or symbols denoted in the drawings of the present specification represent members or components that perform the substantially same functions. For easy understanding, the sizes and shapes of components shown in the drawings are more or less exaggeratedly shown.

The terms used in the present specification are used to describe embodiments of the disclosure. Accordingly, it should be apparent to those skilled in the art that the following description of embodiments is provided for illustration purpose only and not for the purpose of limiting embodiments as defined by the appended claims and their equivalents. It is to be understood that the singular forms "a," "an," and "the" include plural referents unless the context clearly dictates otherwise.

It will be understood that when the terms "includes," "comprises," "including," and/or "comprising," when used in this specification, specify the presence of stated features, figures, steps, components, or combinations thereof, but do not preclude the presence or addition of one or more other features, figures, steps, components, members, or combinations thereof.

It will be understood that, although the terms first, second, etc. may be used herein to describe various components, these components should not be limited by these terms. These terms are only used to distinguish one component from another. For example, a first component could be termed a second component, and, similarly, a second component could be termed a first component, without departing from the scope of the disclosure. As used herein, the terms "1st" of "first" and "2nd" or "second" may use corresponding components regardless of importance or order and are used to distinguish a component from another component without limiting the components. Expressions such as "at least one of" when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, embodiments of the disclosure will be described in detail with reference to the appended drawings.

Figure 2:
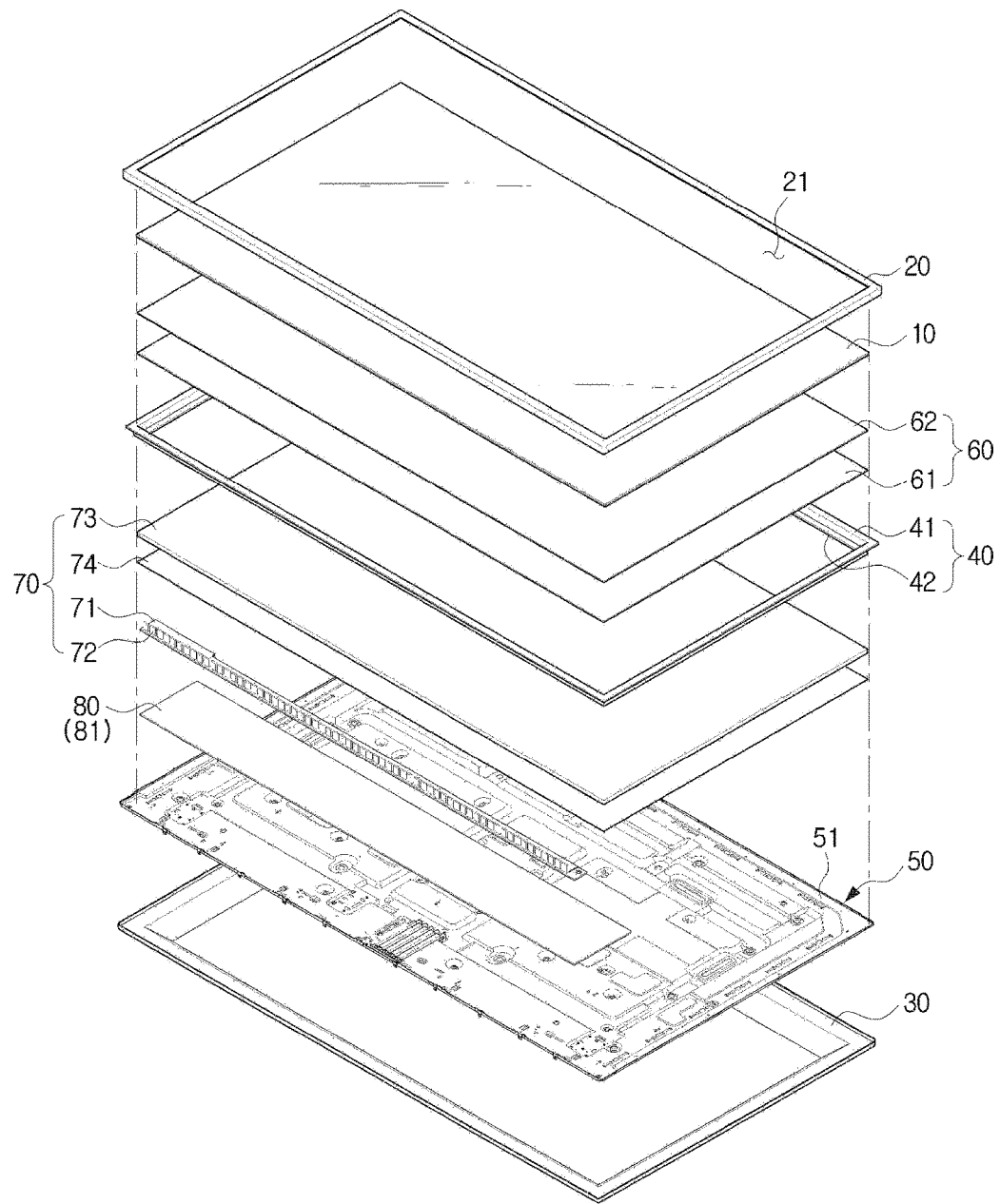
FIG. 2 is an exploded perspective view of a display apparatus according to an embodiment.

FIG. 1 is a perspective view of a display apparatus according to an embodiment of the disclosure, and FIG. 2 is an exploded perspective view of a display apparatus according to an embodiment of the disclosure.

As shown in FIG. 1, a display apparatus 1 may be a flat panel display apparatus in which a display panel 10 for displaying images is flat. However, the display apparatus 1 may be a curved display apparatus having a curved display panel, or a bendable display apparatus having a display panel that can change its state from a flat state to a curved state and vice versa or that can change a curvature of the curved surface.

Referring to FIGS. 1 and 2, the display panel 10 may be a Liquid Crystal Display (LCD) panel. The LCD panel displays images using liquid crystals showing optical properties according to a change in voltage and temperature. The LCD panel is configured with a Thin Rim Transistor (TFT) substrate, a color filter substrate coupled with the TFT substrate in such a way to face the TFT substrate, and liquid crystals injected between the TFT substrate and the color filter substrate. The TFT substrate is a transparent substrate on which TFTs used as switching devices are mounted in a matrix form, and the color filter substrate is a transparent substrate on which red, blue and green (RGB) color pixels showing unique colors are formed by thin-film processing.

The display apparatus 1 may include a backlight 70 to provide light to the display panel 10. The backlight 70 may be disposed below the display panel 10 to emit light toward the display panel 10.

The backlight 70 may be an edge type in which a plurality of light sources 72 are disposed along at least one of the edges of the display panel 10. The backlight 70 may be a direct-type backlight in which light sources are disposed immediately below the display panel 10.

The backlight 70 may include the light sources 72, a Printed Circuit Board (PCB) 71 on which the light sources 72 are mounted, and various optical members disposed on a transfer path of light emitted from the light sources 72.

The light sources 72 may be Light Emitting Diodes (LEDs). The LEDs may be provided in the form of a package in which LED chips are mounted on a substrate and a resin is filled thereon. Meanwhile, the light sources 72 may be Cold Cathode Fluorescent Lamps (CCFLs) or External Electrode Fluorescent Lamps (EEFLs).

On the PCB 71, the plurality of light sources 72 may be arranged in a line along the edge of the display panel 10. A circuit pattern for transferring a driving voltage and signals to the light sources 72 may be printed on the PCB 71. The PCB 71 may be mounted on the bottom chassis 50.

The optical members may be disposed on the transfer path of light emitted from the light sources 72 to guide a transmission direction of light or to improve optical properties. The optical members may include a light guide plate 73 to uniformly distribute light emitted from the light sources 72 toward the display panel 10, and a reflector sheet 74 to prevent light loss by reflecting light.

The light guide plate 73 may be made of Poly Methyl Methacrylate Acrylate (PMMA). In the light guide plate 73, a pattern for changing a path of light may be formed. When the backlight 70 is an edge-type backlight, the light sources 72 may be arranged along an edge of the light guide plate 73. Light incident to the edge of the light guide plate 73 may be scattered by the pattern formed on a lower surface of the light guide plate 73, and thus emitted through the upper surface of the light guide plate 73.

The reflector sheet 74 may reflect light emitted from the light sources 72 to prevent light loss through the lower surface of the light guide plate 73. The reflector sheet 74 may be manufactured in various forms, such as a sheet, a film, and a plate. For example, the reflector sheet 74 may be formed by coating a high reflective material on a base material. The base material may be stainless steel, brass, aluminum, or polyethylene terephthalate (PET), and the high reflective material may be silver or $TiO_2$.

The reflector sheet 74 may be disposed and supported on the PCB 71. The light guide plate 73 may be disposed on the reflector sheet 74. The light guide plate 73 may be spaced a predetermined distance from the light sources 72 at the edge in consideration of thermal expansion.

The optical members may further include a quantum dot interface or a quantum dot sheet. The quantum dot interface or the quantum dot sheet may change the wavelength of light to improve color reproduction. The color reproduction is a standard for representing similarity to natural colors, and shows how wide range of colors is represented on color coordinates. The quantum dot interface or the quantum dot sheet may be disposed on the path of light between the light sources 72 and the display panel 10.

The display apparatus 1 may include various optical sheets 60 to improve optical properties. The optical sheets 60 may be disposed on the light guide plate 73 in order to improve the optical properties of light emitted from the light guide plate 73.

The optical sheets 60 may include a diffuser sheet 61 and a prism sheet 62. Because light guided through the light guide plate 73 is output for display, the pattern of the light guide plate 73 will be reflected. For this reason, the diffuser sheet 61 may be provided to cancel or minimize the pattern of the light guide plate 73.

The prism sheet 62 may focus light whose brightness is lowered when it passes through the diffuser sheet 61 to thus improve the brightness of the light. The prism sheet 62 may be a Dual Brightness Enhancement Film (DBEF) sheet which is a high-brightness prism sheet.

The optical sheets 60 may further include a protection sheet to protect the optical sheets 60 from an external impact or entrance of foreign materials. The optical sheets 60 may be disposed between the light guide plate 73 and the display panel 10.

The display apparatus 1 may include a chassis assembly to accommodate and support the display panel 10 and the backlight 70. The chassis assembly may include a top chassis 20, a middle mold 40, and a bottom chassis 50.

The top chassis 20 may define an opening 21 through which the display panel 10 is exposed. The middle mold 40 may include a middle mold side portion 41 and a middle support portion 42 protruding inward from the middle mold side portion 41. The middle mold 40 may support the display panel 10 and the optical members, and maintain spacing between the display panel 10 and the optical members.

The bottom chassis 50 may support the backlight 70. Various components of the display apparatus 1, such as the top chassis 20 and the middle mold 40, may be fixed on and supported by the bottom chassis 50.

On an upper surface 51 of the bottom chassis 50, the PCB 71 of the backlight 70 may be mounted. The bottom chassis 50 may radiate heat generated from the light sources 72 to the outside. Heat generated from the light sources 72 may be transferred to the bottom chassis 50 via the PCB 71, and then radiated from the bottom chassis 50.

The display apparatus 1 may include a heat sink 80 to absorb heat generated from the backlight 70 and to emit the absorbed heat to the outside. The heat sink 80 may be disposed between the PCB 71 and the bottom chassis 50. The heat sink 80 may be connected to the bottom chassis 50. The heat sink 80 may be made of various metal materials (for example, aluminum and stainless steel) having high heat conductivity, or plastic materials such as an Acrylonitrile-Butadiene-Styrene (ABS) resin.

The bottom chassis 50 may also be made of one of various metal materials (for example, aluminum and stainless steel) having high heat conductivity, or a plastic material such as an ABS resin. The PCB 71 may also be a metal PCB made of an aluminum material having high heat conductivity.

At least one of the top chassis 20, the middle mold 40, and the bottom chassis 50 may be omitted, or the top chassis 20, the middle mold 40, and the bottom chassis 50 may be integrated into one body. The display apparatus 1 may include a rear cover 30 surrounding the chassis assembly in order to protect and accommodate the chassis assembly. The display apparatus 1 may further include a leg for supporting the display apparatus 1 on an installation surface.

Figure 3:
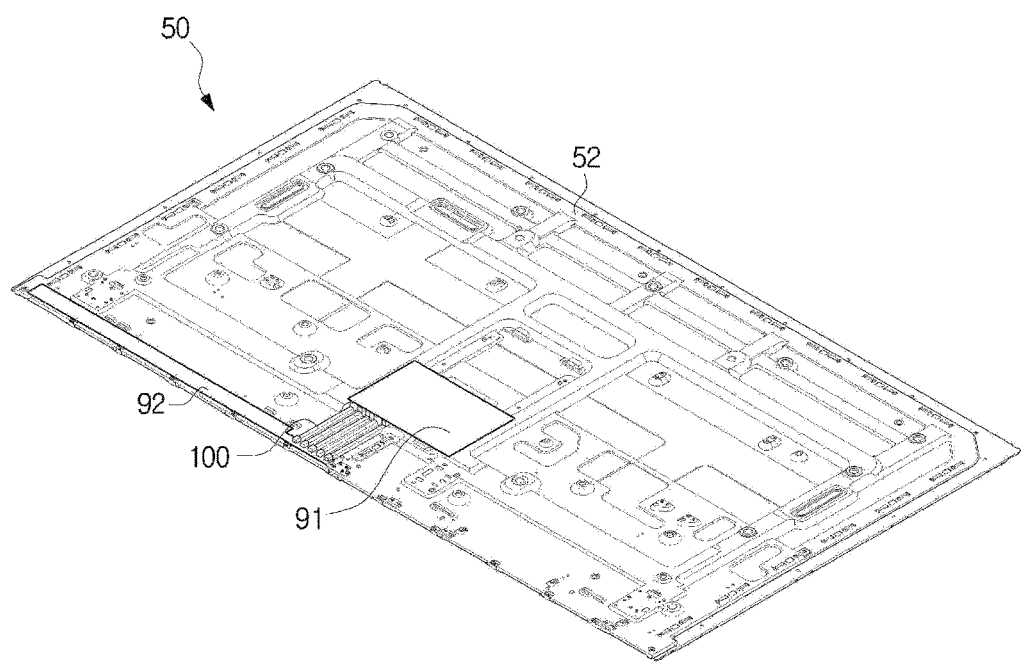
FIG. 3 shows a lower surface of a bottom chassis of a display apparatus according to an embodiment.
Figure 4:
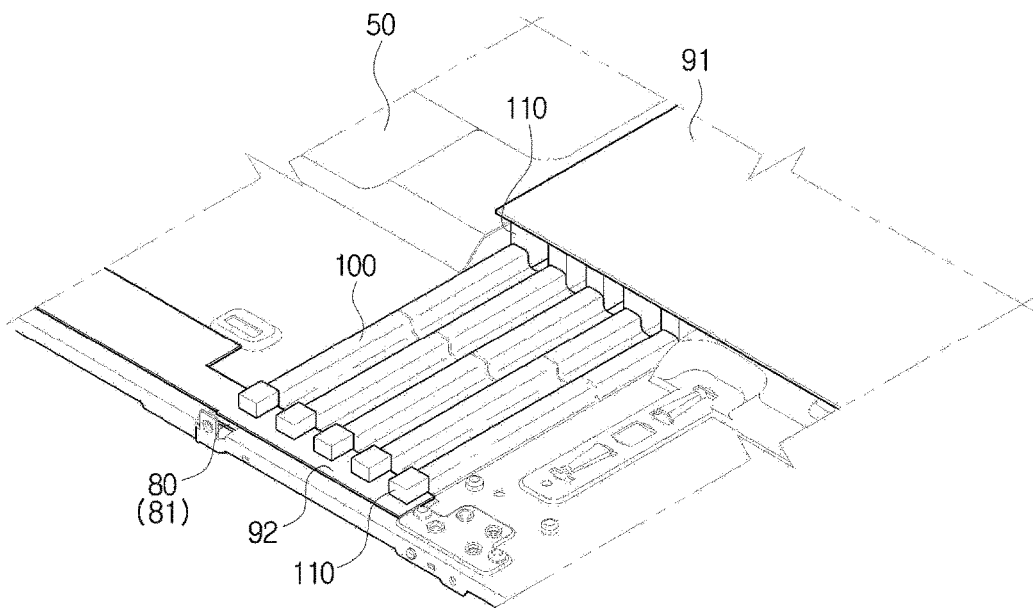
FIG. 4 is an enlarged view of an area of the bottom chassis shown in FIG. 3.

FIG. 3 shows a lower surface of a bottom chassis of a display apparatus according to an embodiment of the disclosure, and FIG. 4 is an enlarged view of an area of the bottom chassis shown in FIG. 3.

The display apparatus 1 may include various circuit boards, such as a main board, a Switched Mode Power Supply (SMPS) board, and a source board.

The main board may include a processor for driving the display apparatus 1, and a power management apparatus. The SMPS board may supply power for driving the display apparatus 1. The source board may control the display panel 10.

The main board, the SMPS board, and the source board may be disposed independently or in combination. When the circuit boards are disposed independently, the circuit boards may be connected to one another in order to transmit/receive data, signals, or power to/from one another.

The circuit boards, when disposed independently, may each include an Integrated Circuit (IC) to transmit/receive data, signals, or power wirelessly to/from one another. The display apparatus 1 may include a waveguide 100 to enable the circuit boards to transmit/receive data, signals, or power wirelessly to/from one another.

Referring to FIGS. 3 and 4, a first circuit board 91 and a second circuit board 92, among various circuit boards, may be mounted on a lower surface 52 of the bottom chassis 50.

The first circuit board 91 and the second circuit board 92 may include ICs to transmit/receive data, signals, or power to/from one another through wireless communication.

The bottom chassis 50 may include the waveguide 100 for wireless communication between the first circuit board 91 and the second circuit board 92. The waveguide 100 may be formed with an independent configuration, and disposed between the first circuit board 91 and the second circuit board 92. The IC of the first circuit board 91 and the IC of the second circuit board 92 may be connected to the waveguide 100 through connectors 110. As shown in FIG. 4, surfaces of the first circuit board 91 and the second circuit board 92 may be in parallel. Further, connectors 110 of the first circuit board 91 and the second circuit board 92 may be aligned with each other.

Figure 5:
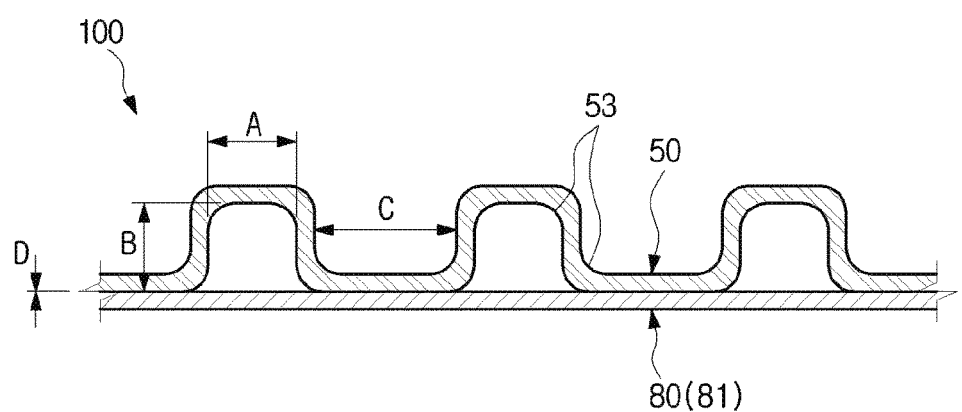
FIG. 5 shows a part of a section of a waveguide shown in FIG. 4.

FIG. 5 shows a part of a section of a waveguide shown in FIG. 4.

Referring to FIG. 5, the waveguide 100 may be in the shape of a duct having four sides. The waveguide 100 may be made of a metal material to transfer electromagnetic waves (EM waves), such as a radio frequency (RF) wave, without leakage.

Height B and width A of the waveguide 100 may be determined based on the wavelength of electromagnetic waves passing through the waveguide 100. Also, the height B and width A of the waveguide 100 may be determined based on permeability or permittivity. The waveguide 100 may have a height B and a width A corresponding to a wavelength of transmitted electromagnetic waves or half of the wavelength of the electromagnetic waves. For example, if the first circuit board 91 transmits electromagnetic waves of 60 GHz to the second circuit board 92, the width A and height B of the waveguide 100 may be 5 mm or 2.5 mm.

The waveguide 100 may include a filler material, such as polyester, polyvinyl chloride (PVC), and the like, therein. Because the propagation speed of electromagnetic waves in such a filler material is lower than that in the air, the wavelength of electromagnetic waves will shorten when the filler material is filled in the inside of the waveguide 100. Therefore, a waveguide 100 including a filler material may have a shorter height B and a shorter width A than a waveguide including no filler material.

The waveguide 100 may be formed by coupling the bottom chassis 50 with the heat sink 80. The bottom chassis 50 may form three of the four sides of the waveguide 100, and the heat sink 80 may form the remaining one of the four sides of the waveguide 100. The bottom chassis 50 may be pressed, injected, or cut to form the three sides of the waveguide 100.

The heat sink 80 may be formed as a flat plate, and coupled with the bottom chassis 50 to form the remaining side of the waveguide 100. In order to prevent electromagnetic waves from leaking out of the waveguide 100, a distance D between the bottom chassis 50 and the heat sink 80 may be 0.1 mm or less.

The display apparatus 1 may include an additional member 81 that is coupled with the bottom chassis 50 to form the waveguide 100, in addition to the heat sink 80. The heat sink 80 shown in the drawings may be replaced with the additional member 81 for forming the waveguide 100. The heat sink 80 or the additional member 81 may be made of a metal material to prevent transmission of electromagnetic waves.

The first circuit board 91 and the second circuit board 92 may need a plurality of channels for wireless communication. The display apparatus 1 may include a plurality of waveguides 100 for wireless communication between the first circuit board 91 and the second circuit board 92. In this case, inter-channel crosstalk between different two waveguides of the plurality of waveguides may occur, and due to the inter-channel crosstalk, jamming may occur. Desired performance can be implemented when inter-channel crosstalk is about −25 dB or less. When waveguides having a width A of 5 mm and a height B of 2.5 mm are formed to transmit electromagnetic waves of 60 GHz, the neighboring waveguides of the waveguides may be spaced at a distance C of 7 mm or longer to prevent jamming.

Each waveguide 100 may include a rounded portion 53 at the edge by processing the bottom chassis 50. The center of curvature of the rounded portion 53 may be located in the inside or outside of the waveguide 100, according to a direction in which the bottom chassis 50 is cut. When the waveguide 100 having the width A of 5 mm and the height B of 2.5 mm is formed, the radius of curvature of the rounded portion 53 may be 1.5 mm or greater.

Figure 6:
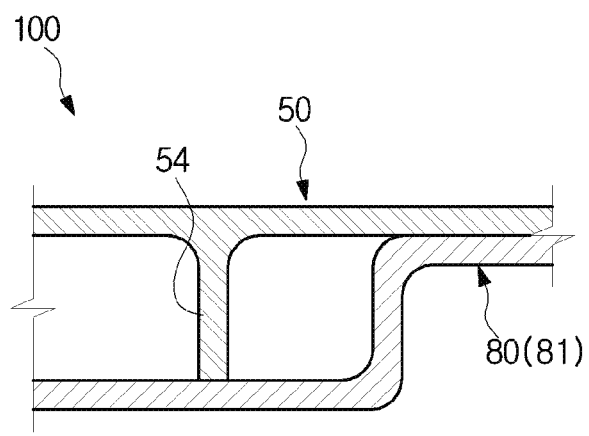
FIG. 6 shows a part of a section of a waveguide in a display apparatus according to another embodiment.

FIG. 6 shows a part of a section of a waveguide 100 in a display apparatus according to another embodiment of the disclosure.

Referring to FIG. 6, the waveguide 100 may be in the shape of a duct having four sides. The waveguide 100 may be formed by coupling the bottom chassis 50 with the heat sink 80. Also, the waveguide 100 may be formed by coupling the bottom chassis 50 with an additional member 81.

The bottom chassis 50 may form two of the four sides of the waveguide 100, and the heat sink 80 or the additional member 81 may form the remaining two of the four sides of the waveguide 100. The bottom chassis 50 may include a flange 54 to form the two sides of the waveguide 100. The heat sink 80 or the additional member 81 may be processed to form the remaining two sides of the waveguide 100.

The bottom chassis 50 may be processed to form the two sides of the waveguide 100, and the heat sink 80 or the additional member 81 may include a flange to form the remaining two sides of the waveguide 100.

The bottom chassis 50, the heat sink 80, and the additional member 81 may be processed by at least one method of press, injection, and cutting in order to form some of the four sides of the waveguide 100. The material, shape, and size of the waveguide 100 may be the same as or similar to those of the waveguide 100 shown in FIG. 5. Accordingly, descriptions about the material, shape, and size of the waveguide 100 will be omitted.

Figure 7:
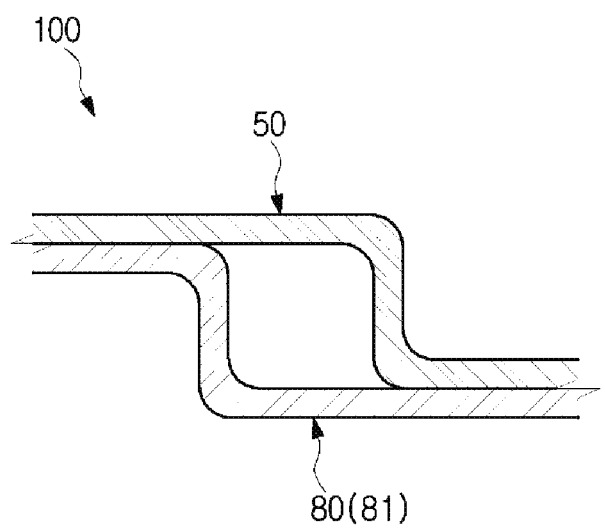
FIG. 7 shows a part of a section of a waveguide in a display apparatus according to another embodiment.

FIG. 7 shows a part of a section of a waveguide 100 in a display apparatus according to another embodiment of the disclosure.

Referring to FIG. 7, the waveguide 100 may be in the shape of a duct having four sides. The waveguide 100 may be formed by coupling the bottom chassis 50 with the heat sink 80. Also, the waveguide 100 may be formed by coupling the bottom chassis 50 with the additional member 81.

The bottom chassis 50 may form two of the four sides of the waveguide 100, and the heat sink 80 or the additional member 81 may form the remaining two of the four sides of the waveguide 100. The bottom chassis 50 may be processed to form the two sides of the waveguide 100. The heat sink 80 or the additional member 81 may be processed to form the remaining two sides of the waveguide 100

The bottom chassis 50, the heat sink 80, and the additional member 81 may be processed by at least one method of press, injection, and cutting in order to form some of the four sides of the waveguide 100. The material, shape, and size of the waveguide 100 may be the same as or similar to those of the waveguide 100 shown in FIG. 5. Accordingly, descriptions about the material, shape, and size of the waveguide 100 will be omitted.

Figure 8:
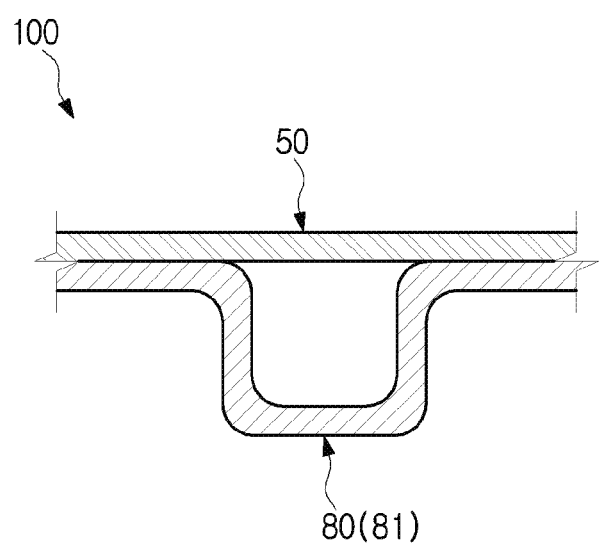
FIG. 8 shows a part of a section of a waveguide in a display apparatus according to another embodiment.

FIG. 8 shows a part of a section of a waveguide 100 in a display apparatus according to another embodiment of the disclosure.

Referring to FIG. 8, the waveguide 100 may be in the shape of a duct having four sides. The waveguide 100 may be formed by coupling the bottom chassis 50 with the heat sink 80. Also, the waveguide 100 may be formed by coupling the bottom chassis 50 with the additional member 81.

The bottom chassis 50 may form one of the four sides of the waveguide 100, and the heat sink 80 or the additional member 81 may form the remaining three of the four sides of the waveguide 100. The heat sink 80 or the additional member 81 may be pressed, injected, or cut to form the three sides of the waveguide 100. The bottom chassis 50 may be formed as a flat plate, and coupled with the heat sink 80 or the additional member 81 to form the remaining side of the waveguide 100.

The material, shape, and size of the waveguide 100 may be the same as or similar to those of the waveguide 100 shown in FIG. 5. Accordingly, descriptions about the material, shape, and size of the waveguide 100 will be omitted.

Figure 9:
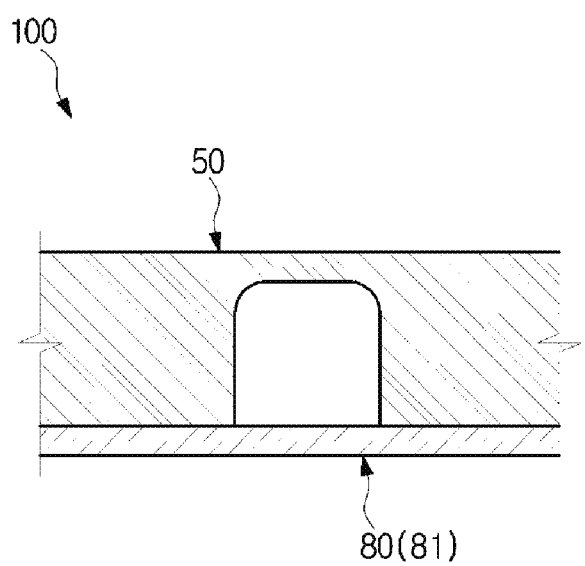
FIG. 9 shows a part of a section of a waveguide in a display apparatus according to another embodiment.

FIG. 9 shows a part of a section of a waveguide 100 in a display apparatus according to another embodiment of the disclosure.

Referring to FIG. 9, the waveguide 100 may be in the shape of a duct having four sides. The waveguide 100 may be formed by coupling the bottom chassis 50 with the heat sink 80. Also, the waveguide 100 may be formed by coupling the bottom chassis 50 with the additional member 81.

The bottom chassis 50 may form three of the four sides of the waveguide 100, and the heat sink 80 or the additional member 81 may form the remaining one of the four sides of the waveguide 100. The bottom chassis 50 may be injected or cut to form the three sides of the waveguide 100. The heat sink 80 or the additional member 81 may be formed as a flat plate, and coupled with the bottom chassis 50 to form the remaining side of the waveguide 100.

The bottom chassis 50 may be formed as a flat plate to form one side of the waveguide 100, and the heat sink 80 or the additional member 81 may be injected or cut to form three sides of the waveguide 100.

The material, shape, and size of the waveguide 100 may be the same as or similar to those of the waveguide 100 shown in FIG. 5. Accordingly, descriptions about the material, shape, and size of the waveguide 100 will be omitted.

Figure 10:
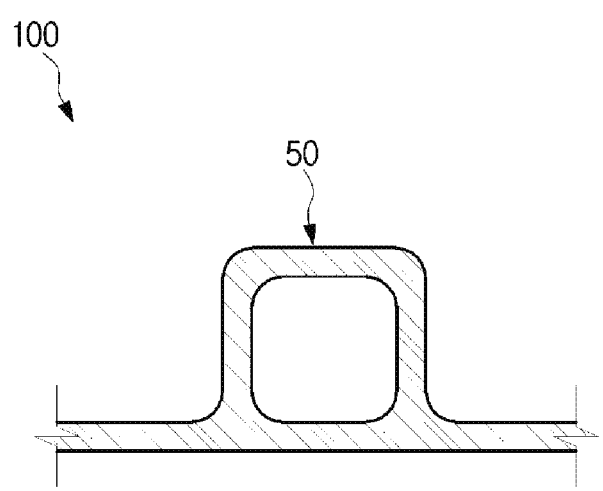
FIG. 10 shows a part of a section of a waveguide in a display apparatus according to another embodiment.

FIG. 10 shows a part of a section of a waveguide 100 in a display apparatus according to another embodiment of the disclosure.

Referring to FIG. 10, the waveguide 100 may be in the shape of a duct having four sides. The waveguide 100 may be formed by making a hole of a duct shape in the bottom chassis 50. The bottom chassis 50 may be injected or cut to include the waveguide 100.

The waveguide 100 may also be formed by making a hole of a duct shape in the heat sink 80 or the additional member 81. Also, the waveguide 100 may be formed in various shapes including a duct shape having a round inside surface.

The material, shape, and size of the waveguide 100 may be the same as or similar to those of the waveguide 100 shown in FIG. 5. Accordingly, descriptions about the material, shape, and size of the waveguide 100 will be omitted.

According to the disclosure, because wireless communication between the circuit boards within the display apparatus is possible, an assembly structure can be simplified, resulting in a reduction of defect factors that may be caused upon assembly.

According to the disclosure, by forming the waveguide for wireless communication between the circuit boards in the bottom chassis of the display apparatus, a manufacturing cost of the display apparatus can be reduced.

Although a few embodiments of the disclosure have been shown and described, it will be appreciated by those skilled in the art that changes may be made in these embodiments without departing from the principles and spirit of the disclosure, the scope of which is defined in the claims and their equivalents.

What is claimed is:

1. A display apparatus comprising:
   a display panel;
   a bottom chassis configured to support the display panel;
   a first circuit board mounted on the bottom chassis;
   a second circuit board mounted on the bottom chassis; and
   a waveguide formed between the first circuit board and the second circuit board, a first side of the waveguide being formed by the bottom chassis.

2. The display apparatus according to claim 1, wherein a portion of the waveguide is formed by the bottom chassis.

3. The display apparatus according to claim 1, wherein the waveguide is in a shape of a duct having four sides, and
   wherein a height of the waveguide and a width of the waveguide correspond to a wavelength of electromagnetic waves transceived between the first circuit board and the second circuit board.

4. The display apparatus according to claim 1, wherein the display apparatus comprises two or more waveguides, and
   wherein adjacent waveguides of the two or more waveguides are spaced at a distance of at least 7 mm.

5. The display apparatus according to claim 1, further comprising a filler material formed in the waveguide.

6. A display apparatus comprising:
   a display panel;
   a first circuit board;
   a second circuit board; and
   a waveguide formed between the first circuit board and the second circuit board, a first side of the waveguide being formed by a bottom chassis of the display apparatus.

7. The display apparatus according to claim 6, wherein the first circuit board and the second circuit board are disposed on the bottom chassis, and
   wherein a portion of the waveguide is formed by the bottom chassis.

8. The display apparatus according to claim 7, further comprising a member coupled with the bottom chassis to form the waveguide with the bottom chassis, and
   wherein the waveguide is in a duct shape having four sides formed by the bottom chassis and the member.

9. The display apparatus according to claim 8, wherein at least one side of the four sides of the waveguide is formed by processing the bottom chassis by at least one method from among press, injection, and cutting, and
   wherein a remaining side of the four sides of the waveguide is formed by processing the member by at least one method from among press, injection, and cutting.

10. The display apparatus according to claim 7, wherein a portion of the waveguide is formed by a hole in the bottom chassis.

11. The display apparatus according to claim 8, wherein the bottom chassis and the member comprises a metal material.

12. A display apparatus comprising:
a display panel;
a heat sink configured to absorb heat generated by the display panel;
a bottom chassis configured to support the display panel and the heat sink;
a first circuit board mounted on the bottom chassis;
a second circuit board mounted on the bottom chassis;
a plurality of first connectors mounted on the first circuit board;
a plurality of second connectors mounted on the second circuit board, each of the plurality of second connectors respectively corresponding to one of the plurality of first connectors; and
a waveguide configured to convey electromagnetic waves between corresponding connectors of the plurality of first connectors and the plurality of second connectors.

13. The display apparatus according to claim 12, wherein a planar surface of the first circuit board is parallel to a planar surface of the second circuit board.

14. The display apparatus according to claim 13, wherein the waveguide comprises a plurality of waveguides, each of the plurality of waveguides respectively corresponding to one of the plurality of first connectors and one of the plurality of second connectors.

15. The display apparatus according to claim 1 further comprising:
a backlight configured to provide light to the display panel; and
a heat sink configured to absorb heat generated by the backlight.

16. The display apparatus according to claim 15, wherein the a portion of waveguide is formed by the heat sink.

17. The display apparatus according to claim 15, wherein the waveguide is in a shape of a duct having four sides,
wherein the bottom chassis is coupled with the heat sink,
wherein the first side of the waveguide is one of the four sides of the duct, and
wherein a second side of the four sides of the duct is formed by the heat sink.

18. The display apparatus according to claim 17, wherein at least one of a third side and a fourth side of the four sides of the waveguide is formed by at least one of the bottom chassis and the heat sink.

19. The display apparatus according to claim 15, wherein the bottom chassis and the heat sink include a metal material.

20. The display apparatus according to claim 17, wherein a distance between the heat sink and the bottom chassis is 0.1 mm or less.

21. The display apparatus according to claim 18, wherein at least one of side of the four sides of the waveguide is formed by processing the bottom chassis by at least one method from among press, injection, and cutting, and
wherein a remaining side of the four sides of the waveguide is formed by processing the heat sink by at least one method from among press, injection, and cutting.

* * * * *